(12) United States Patent
Palfer-Sollier et al.

(10) Patent No.: US 11,688,482 B2
(45) Date of Patent: Jun. 27, 2023

(54) DIGITAL CIRCUIT TESTING AND ANALYSIS MODULE, SYSTEM AND METHOD THEREOF

(71) Applicant: NUMASCALE AS, Oslo (NO)

(72) Inventors: Thibaut Palfer-Sollier, Oslo (NO); Einar Rustad, Oslo (NO); Steffen Persvold, Oslo (NO)

(73) Assignee: NUMASCALE AS, Oslo (NO)

( * ) Notice: Subject to any disclaimer, the term of this patent is extended or adjusted under 35 U.S.C. 154(b) by 44 days.

(21) Appl. No.: 17/266,420

(22) PCT Filed: Aug. 5, 2019

(86) PCT No.: PCT/EP2019/071023
§ 371 (c)(1),
(2) Date: Feb. 5, 2021

(87) PCT Pub. No.: WO2020/030590
PCT Pub. Date: Feb. 13, 2020

(65) Prior Publication Data
US 2021/0295939 A1    Sep. 23, 2021

(30) Foreign Application Priority Data
Aug. 8, 2018    (EP) ..................... 18188038

(51) Int. Cl.
*G11C 29/32*    (2006.01)
*G11C 29/12*    (2006.01)
(Continued)

(52) U.S. Cl.
CPC .......... *G11C 29/32* (2013.01); *G11C 29/1201* (2013.01); *G11C 29/38* (2013.01);
(Continued)

(58) Field of Classification Search
None
See application file for complete search history.

(56) References Cited

U.S. PATENT DOCUMENTS

| 4,051,354 A | 9/1977 | Choate |
| 6,038,182 A * | 3/2000 | Hwang ............... G11C 29/02 |
| | | 365/201 |

(Continued)

FOREIGN PATENT DOCUMENTS

| GB | 2235555 A | * 3/1991 | ............ G11C 29/28 |
| JP | 2000285698 A | * 10/2000 | |

(Continued)

OTHER PUBLICATIONS

International Search Report and Written Opinion mailed in PCT/EP2019/071023 dated Oct. 4, 2019.

(Continued)

*Primary Examiner* — Guerrier Merant
(74) *Attorney, Agent, or Firm* — Wissing Miller LLP

(57) ABSTRACT

The present invention is related to a digital circuit testing and analysis module system comprising a memory (22). The memory (22) is addressed by numerical values defined by a group of digital signals. A respective memory location associated with a specific numerical value indicates a status of the group of digital signals. The status can for example reflect the validity of the signals in the group of signals when testing a circuit.

15 Claims, 4 Drawing Sheets

(51) Int. Cl.
  *G11C 29/38* (2006.01)
  *G11C 29/54* (2006.01)
  *G11C 29/04* (2006.01)

(52) U.S. Cl.
  CPC ...... *G11C 29/54* (2013.01); *G11C 2029/0401* (2013.01); *G11C 2029/3202* (2013.01)

(56) References Cited

U.S. PATENT DOCUMENTS

| | | | |
|---|---|---|---|
| 6,704,889 B2 | 3/2004 | Veenstra et al. | |
| 9,159,454 B2* | 10/2015 | Lee | G11C 29/10 |
| 9,857,425 B2* | 1/2018 | Song | G06F 11/273 |
| 2001/0023466 A1* | 9/2001 | Farmwald | G11C 8/12 |
| | | | 711/E12.089 |
| 2005/0071580 A1* | 3/2005 | LeClerg | G11C 29/26 |
| | | | 711/154 |
| 2007/0112544 A1 | 5/2007 | Browen | |
| 2008/0008022 A1* | 1/2008 | Song | G11C 11/406 |
| | | | 365/222 |
| 2011/0047423 A1 | 2/2011 | Bailey | |
| 2012/0204069 A1* | 8/2012 | Hughes | G11C 29/16 |
| | | | 714/E11.162 |

FOREIGN PATENT DOCUMENTS

| | | | | |
|---|---|---|---|---|
| JP | 2003196999 A | * | 7/2003 | |
| WO | WO-9910754 A1 | * | 3/1999 | ....... G01R 31/31919 |

OTHER PUBLICATIONS

European Search Report mailed in EP 18188038 dated Jan. 10, 2019.

* cited by examiner

Figure 3A                                    Figure 3B

DIGITAL CIRCUIT TESTING AND ANALYSIS MODULE, SYSTEM AND METHOD THEREOF

CROSS-REFERENCE TO RELATED APPLICATIONS

This application is a 371 of PCT/EP2019/071023 filed on Aug. 5, 2019, published on Feb. 13, 2020 under publication number WO 2020/030590 A1, which claims priority benefits from European Patent Application No. 18188038.6 filed Aug. 8, 2018, the disclosures of each are incorporated herein in their entirety by reference.

FIELD OF THE INVENTION

The present invention relates to a digital module, system and method thereof providing digital circuitry testing and analysis, wherein a selected and ordered group of digital signals from a digital circuit is used as an address input to a digital memory, wherein a single output signal from the memory provides a status of a test and/or analysis of the selected group of digital signals.

BACKGROUND OF THE INVENTION

Recent development of new technologies, like nanometre technologies, has pushed the geometry of components in integrated circuits down to 20 nm or even smaller geometry dimensions. This has allowed the semiconductor industry to provide higher performance and capacity of integrated circuits. At the same time, the complexity of testing and verifying performance of increased complexity of integrated circuits is also increasing. Some reports indicates that the cost of testing has been growing steadily and typically amounts to 40% of product costs. How to test a complex integrated circuit, and how to interpret complex test results, is a demanding and often a time consuming part of a process of testing complex chips.

A preferred option in view of production cost and complexity of circuits is to design and manufacture an Application Specific Integrated Circuit (ASIC chip) or a System On a Chip (SOC) integrated circuit. Hardware description languages help designers to specify functional blocs and interconnections between blocks as well as simulating the behavior of a new design before production. A specific benefit of ASIC and SOC designs is the ability to benefit from pre-defined and tested cells comprising respective logic functions.

CAD tools developed for ASIC and SOC designs may comprise cell libraries (collection of low-level electronic logic functions, for example) from device manufacturers. When designing a specific circuitry, the design is made from interconnecting cells, and the CAD tool translates the specified circuit into production masks for example defined by a vendor as known in prior art. There are also some examples of sharing debugged cells through an organization like OpenCores https://opencores.org/.

In recent years, a common method of making an ASIC is a method denoted as a structured design method. The basic premise of a structured ASIC design is that both manufacturing cycle times and design cycle times are reduced compared to cell-based ASICs. In this method there are pre-defined metal layers (thus reducing manufacturing time) from a vendor, and pre-characterization of what is on the silicon (thus reducing design cycle time). Different designs and customization is made by creating custom metal layers that create custom connections between predefined lower-layer logic elements. The benefit of this method is that only a small number of chip layers must be custom-produced in contrast to other known methods.

However, even though a structured ASIC design method probably increases the probability of achieving a functional circuit, the complexity may in itself be a reason for errors in the design. There is always a need of debugging a physical version of a chip before certifying if an ASIC or SOC design is functioning as expected. Some errors can be detected very quickly by observing signals on input/output pins (ports) of a chip, while other errors may only be apparent after a longer time of use of the ASIC. It is also necessary assessing performance of the design. However, identifying why a circuit is not functioning as anticipated requires more than just observing input/output signals.

An example of an approach is implementing BIST (Built-In Self-Test) circuitry in an ASIC or SOC.

Another approach is implementing Boundary Scan techniques. IEEE 1149.1 defines a scan standard denoted JTAG. A scan shift register is incorporated in the chip circuit boundary, thereby the circuitry can be controlled and observed without requiring physical access to the interior of the chip.

A typical test method comprises a test pattern generator providing stimuli signals to a device under test. A priori, reference signature patterns associated with respective test patterns are generated. Both stimuli and expected responses can be found using for example a simulator as known in prior art. Reference signature patterns are compared with output response signals associated with respective test patterns. The comparison can identify if the circuit is functional or faulty. Further, a specific combination of a test pattern and the corresponding response may identify which internal functional block of the chip is failing, even identifying which part of the functional block that is failing. This may provide information for a redesign of the circuitry. If the complexity of for example an ASIC is high, a huge number of test patterns is required. This again implies using large memory blocks (JTAG scanning register(s) for example), which cost money and is using larger areas of a chip, which instead could be used for implementing further functionality of the ASIC or SOC chip.

U.S. Pat. No. 6,704,889 B2 disclose a logic analyser embedded into for example a PLD (Programmable Logic Device) circuit. The logic analyser captures and stores logic signals. These signals are transferable for viewing on a computer. Using an electronic design automation (EDA) software tool running on a computer system, an engineer specifies signals of the PLD to be monitored, a breakpoint, total number of samples to be stored, number of samples to be captured after the breakpoint occurs, and a system clock signal. The EDA tool automatically inserts the logic analyser into the electronic design of the PLD. Using an interface connected between the PLD and the computer, the EDA tool commands the embedded logic analyser to run. Signals are stored continuously while running in a ring buffer RAM memory. Once the breakpoint occurs, more samples are captured if desired. A JTAG port controls the logic analyser.

Even though lots of data may be captured, it is still necessary to decode and analyse identified states of respective signals (including statefull data) as well as groups of signals. This may be difficult and time consuming.

Generally, besides the need of debugging internal functionality of complex chips, it is also necessary to be able to test performance of working chips, i.e. if the design meets specific design criteria. It may also be that errors only appear after using a chip over time, for example a problem with heat sink of the chip, or that a specific condition of a rarely happening combination of states of the logic circuitry blocks or stops the circuitry to continue to next expected (designed) states.

Therefore, it is a need of a solution providing configurable testing, i.e. customizing specific and general tests and/or respective analysis schemes, that is a best tradeoff between used chip area of on-chip test logic, and the complexity of the test logic. Further, providing enhanced analysis capabilities of the results from the testing as well as providing performance monitoring, tracking of functional changes of statefull data etc., and other forms of monitoring circuitry behavior inside for example a complex ASIC or SOC circuitry is preferable.

Object of the Invention

It is a further object of the present invention to provide an alternative to the prior art.

In particular, it may be seen as an object of the present invention to provide a digital circuit testing and analysis module comprising a memory with one bit wide words comprising a downloadable bit pattern associated with a test and analysis result of a digital circuit, wherein the memory is addressable by an ordered grouping, or sequence, of digital signals of interest for the test and analysis of the digital circuit.

SUMMARY OF THE INVENTION

Thus, the above-described object and several other objects are intended to be obtained in a first aspect of the invention by providing a digital circuit testing and analysis module comprising a memory with downloadable one-bit values associated with respective corresponding numerical values of a group of digital signal levels being monitored by the digital circuit testing and analysis module.

The invention is particularly, but not exclusively, advantageous for obtaining a digital circuit testing and analysis module comprising:
- at least one digital signal input bus comprising D digital signals,
- a memory configured to have $2^D \times$one-bit memory locations,
- wherein the D digital signals are applied as a numerical read out address of respective one-bit memory locations of the memory,
- respective one-bit memory locations are pre-updated with a bit-value indicating a test and/or analysis status of the combination of any D digital signal levels that at any time is applied on the at least one digital input signal bus.

The present invention is particularly, but not exclusively, advantageous for obtaining a method of analysing timing events in a digital circuit, wherein the method utilizes at least one instance of a digital circuit testing and analysis module, according to the present invention, embedded in circuitry of a chip to be tested and analysed, comprising steps of:
- configuring respective test and analysis status bits of the one-bit memory of the at least one instance of the digital circuit testing and analysis module,
- configuring a qualifier signal enabling the test and/or analysis status signal of the at least one instance of the testing and analysis module, wherein issuing of the qualifier signal is associated with a timing event in the circuitry to be tested and analysed.

Further, the invention is advantageous of obtaining a system comprising multiple interconnected digital circuit testing and analysis modules.

Respective aspects of the present invention may each be combined with any of the other aspects. These and other aspects of the invention will be apparent from and elucidated with reference to the embodiments described herein.

DETAILED DESCRIPTION OF AN EMBODIMENT

Figure 1:
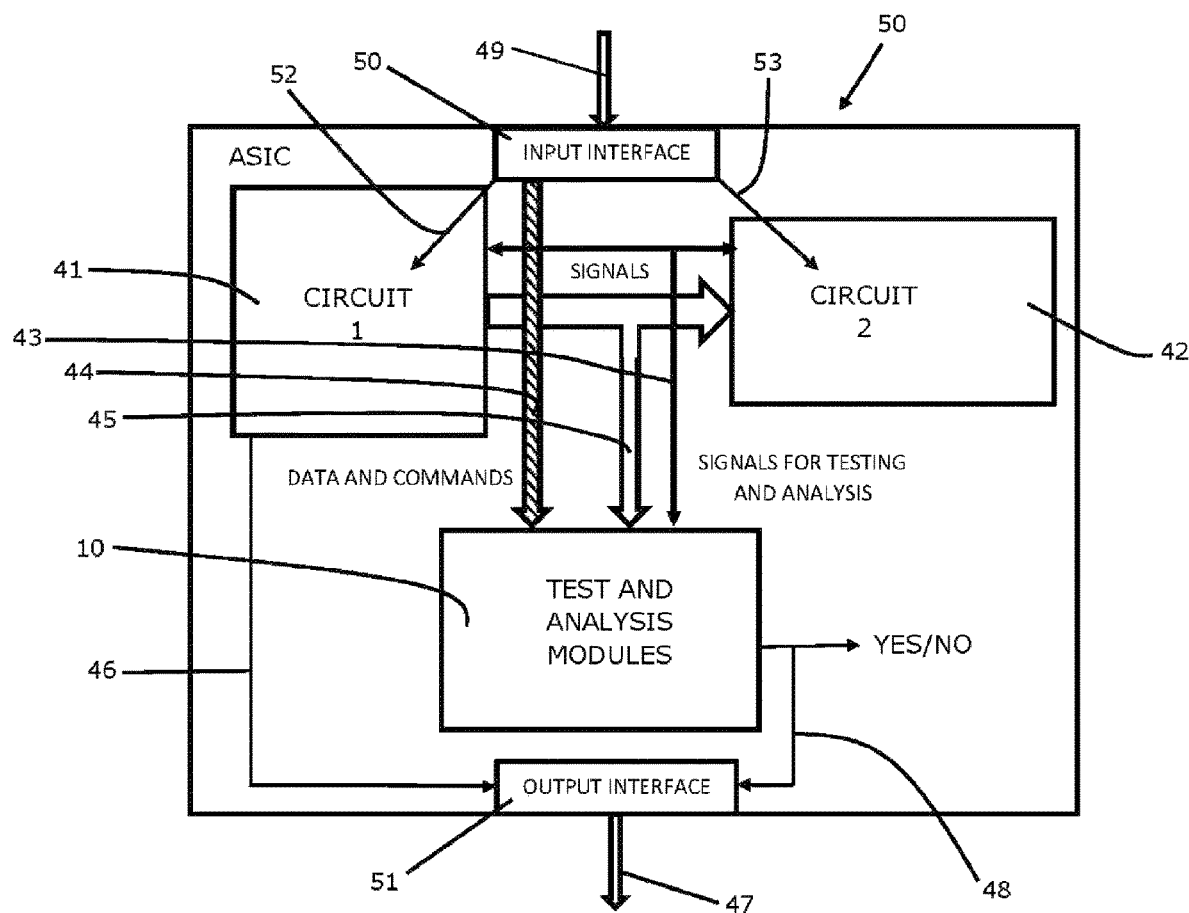
FIG. 1 illustrates an example of embodiment of the present invention

Although the present invention is disclosed in connection with specific examples of embodiments, it should not be construed as being in any way limited to the presented examples. The accompanying claim set defines the scope of protection of the present invention. In the context of the claims, the terms "comprising" or "comprises" do not exclude other possible elements or steps. Further, the mentioning of references such as "a" or "an" etc. should not be construed as excluding a plurality. The use of reference signs in the claims with respect to elements indicated in the figures shall also not be construed as limiting the scope of the invention. Furthermore, combining individual features mentioned in different claims may possibly be advantageously, and the mentioning of these features in different claims does not exclude that a combination of features is not possible and advantageous.

An aspect of the present invention is to use high density memories providing high chip area and power efficiency. The architecture of examples of embodiments of the present invention comprises a memory with one bit wide words. At least one instance of the digital circuit testing and analysis module architecture is embedded in an ASIC and/or SOC chip circuitry.

The memory, for example a static RAM, which is a one bit wide memory, has a length, i.e. number of one bit memory locations, that is equal to the total number of combinations of internal digital signals on a chip that is selected to be tested or analyzed. For example, if sixteen digital signals of internal chip signals are grouped together in an ordered fashion and tested and analyzed, 64k of one-bit wide memory locations is required. The grouping or sequence of digital signals being analyzed or tested is used as an address of the memory, i.e. an ordering of the grouping or sequence of digital signal levels corresponds to a binary number value which is the memory address associated with a specific combination of signal levels. If a specific combination of digital signal levels is valid, i.e. fulfils a predefined combination of signal levels associated with for example a specific stimuli of the circuit, the corresponding one-bit memory location, addressed by the signals being monitored, is preset to for example logic one. Then the one bit memory location indicates that a correct signal level combination of the selected signals in the group is detected. Different signal level combinations will address respective different associated one-bit memory locations comprising for example logic one if they represent valid digital signal level combinations, or for example logic "0" if they represent an invalid (wrong) signal level combination.

The content of the memory is defined when a test is designed, i.e. an association of stimuli (test patterns) of the circuit on the chip versus expected signal level combinations of the signals being monitored. An association can also be defined dependent on a certain combination of signals appearing not only due to specific stimuli, but as a result of computations inside the chip under test, or as a result of artificial intelligence based results (machine learning). Such associations may be found via computer simulations as known in prior art. The memory is initialized with the correct one bit values in the respective memory locations before a test is started, and a simple and fast memory look-up process finds the association between responses of a test and validity of responses.

When an ASIC circuit is developed by a designer, the result may be as illustrated in FIG. 1. A first circuit 41 is communicating signals to a second circuit 42. Signals may be sent both ways. The example in FIG. 1 illustrates a unidirectional digital signal bus 45, and a single bidirectional digital signal line 43 between the first and second circuit 41, 42. During the design phase, the designer can decide which internal signals of the ASIC that should be used when testing and analyzing a manufactured ASIC circuit. In the example of FIG. 1, the digital signal bus 45 and the single bidirectional signal line 43 is connected to an instance of the test and analysis module 10 according to the present invention embedded into the circuitry of the ASIC 40.

The input interface 50 of the ASIC 40 is providing access from an external computer, via for example a connection 49, wherein the computer is configured to run tests and analysis programs designed for the ASIC 40, including generating stimuli signals, test patterns etc. as well as reading out status signals 48, and other resulting states of signals indicative of test and/or analysis results. The output interface 51 can be connected to the external computer system running the test and analysis program(s).

The input interface 50 may comprise input stimuli signals like the illustrated stimuli signals 52, 53 stimulating the circuit 1 and circuit 2, clock signals etc. designed to be applied on the first and respective second circuits 41, 42.

There is also a data, command, and digital signal bus 44 from the input interface 50 providing a direct connection between the instance of the test and analysis module 10 and the external computer system. Then data and/or commands (and/or control signals) can be given to the instance of the test and analysis module 10 embedded into the ASIC 40.

One of the possible output signals from the test and analysis module 10 is a test and/or analysis status signal 48 that is indicated in FIG. 1 to be either yes or no, (i.e. a test or analysis is positive or negative, true or false etc.). Status signals like the "yes/no" signal and other signals (for example signal 46) from respective circuits inside the ASIC 40 may also be connected to the output interface 51. The external computer may be connected to the output interface 51 via the connection 47.

Figure 2:
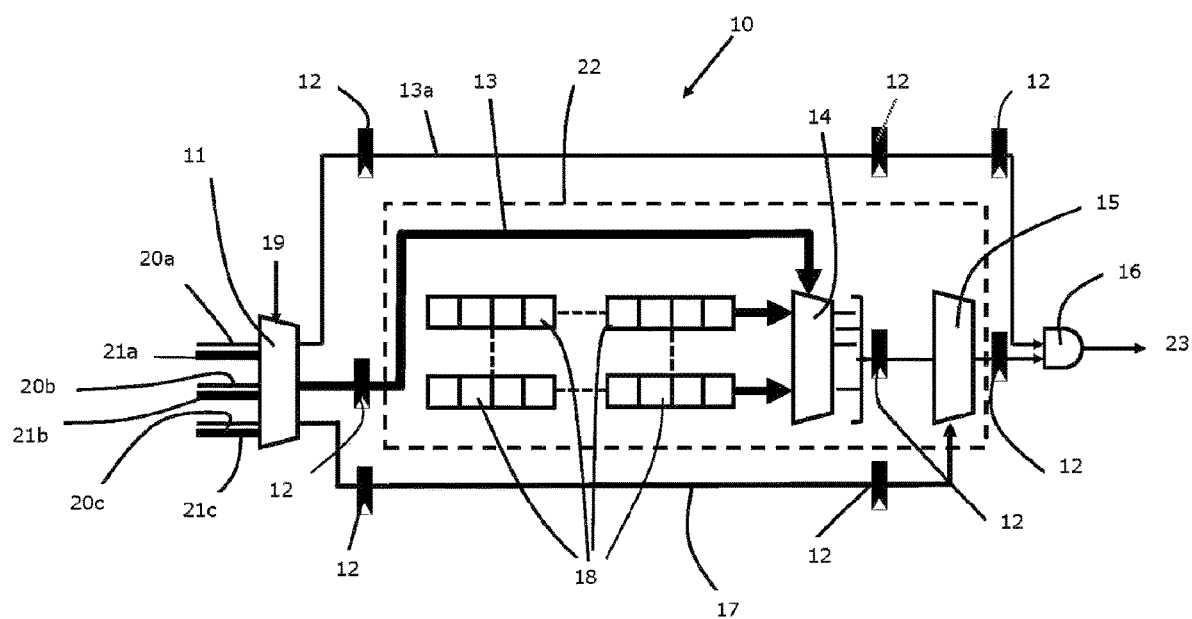
FIG. 2 illustrates details of an example of embodiment of the present invention.

A basic working principle of a digital circuit testing and analysis module 10 according to the present invention is disclosed in FIG. 2.

In FIG. 2, the signals 43 and 45 in FIG. 1 are for example selected and is connected by the designer to respective input ports or at least to one digital input signal buss 21a, 21b, 21c of the instance of the test and analysis module 10 in FIG. 2.

As mentioned above, test patterns (stimuli) and response signals are found using a digital simulator for example. The selected signals 43, 45 may be found to have certain signal level combinations that represent valid or not valid responses to specific test patterns (stimuli).

The selected signals and their respective signal levels are used as a corresponding address input to a one bit wide memory, wherein a specific combination of signal levels of the selected digital signals forms specific patterns the simulator has identified as a valid or not valid response to a stimuli applied to the ASIC circuit under test and analysis.

If a specific combination of the selected digital signals has a valid signal level combination, the one bit memory location addressed by the selected digital signals has been initialized with a logic "1" before the test and analysis is performed, for example via the signals 44 from the input interface 50 illustrated in FIG. 1. When a test is run, and if the same signal level pattern appears, the one bit addressed location will comprise a logic "1", and the outcome of the test and/or analysis is therefore that the circuitry probably is working correctly.

Other memory locations can be initialized to be logic "zero" or logic "1" dependent on respective sequences of test patterns or stimuli of the digital circuit under test and/or analysis. To be able to conclude that the circuit is working, several tests and analysis must be performed. In between different tests and analysis, the content of the one-bit wide memory may be updated by the computer running the test and analysis program(s) via the input interface 50, to be consistent with a specific test and/or analysis to be performed.

The example of a digital circuit testing and analysis module in FIG. 2 receives digital signals on at least three different digital input signal busses, a first digital signal input bus 21a, a second digital signal input bus 21b, a third digital signal input bus 21c, which are multiplexed by the multiplexer 11. The output from the multiplexer 11 is divided into two separate digital signal busses, a first bus 13 denoted "SRAM macro index", and a second bus 17 denoted "Bit index".

In the example of FIG. 2, the respective digital input signal busses are sixteen bits wide, and the memory of the test and analysis module should be 64k by one bit. The first internal bus "SRAM macro index" 13 is eleven bits wide and the second internal bus "Bit index" 17 is five bits wide. A first control signal 19 selects which one of the three digital input signal busses passes to the output of the multiplexer 11. The multiplexer 11 may have latched outputs thereby the output of the multiplexer stays stable until a new first control signal 19 is applied, i.e. first removed and then applied again.

The example of memory 22 in FIG. 2 is a 2k by thirty-two bits wide memory. The eleven bits of the first internal bus 13 from the multiplexer 11 is used to address the 2k memory. When an address is applied, the associated 32 bits word 18 of the 2k memory is visible on the output of the memory 22. Memory read out circuitry 14 receives the first internal bus 13 "SRAM macro index" signals and output the associated data word 18 of 32 bits. The output of the memory 22 is connected to a multiplexer 15, which is controlled by the second internal bus 17 "Bit index". The multiplexer 15 selects via the content on the second internal bus 17 the one bit, out of the thirty-two bits of the selected data word 18, which is identifying a status of the digital input signals originating from the output of the multiplexer 11, and which are selected by the control signal 19.

Digital signals on a respective digital signal input bus may at a given time form a pattern that is to be analyzed, but the pattern may not be a pattern that is intended to be analyzed at this moment in time, or is never intended to be analyzed at all. Therefore, each respective digital signal input bus is associated with a respective qualifier signal 20*a* for the digital signal input bus 21*a*, a qualifier signal 20*b* for the digital signal input bus 21*b*, and a qualifier signal 20*c* for the digital signal input bus 21*c*. When selecting a respective bus with the first control signal 19, the associated qualifier signal 20*a*, or 20*b*, or 20*c* is passed through the multiplexer 11 as a common qualifier signal 13*a*, which is a qualifier signal indicating that the data on the associated signal input bus should be analyzed. The qualifier signal 13*a* is passed to a logic AND gate 16 connected to the output of the multiplexer 15, i.e. the one bit status bit from the memory 22. If the qualifier signal 13*a* is set to be logic true (i.e. one) the digital circuit testing and analysis module 10 knows this is a pattern to be analyzed. The output 23 from the AND gate 16 provides the output signal denoted a test and/or status signal, i.e. a true or false status signal dependent on the value stored in the one-bit memory location addressed by the combination of the signal levels on the first bus 13 and the second bus 17, i.e. the signals to be tested and analysed.

According to an example of embodiment of the present invention, a digital circuit testing and analysis module (10) comprises:

- at least one digital signal input bus comprises D data signals,
- a memory (22) configured to have $2^D \times$ one bit memory locations,
- wherein the D digital signals are applied as a corresponding numerical read out address of respective one-bit memory locations of the memory (22),
- respective one-bit memory locations can be pre-initialized with a bit-value indicating a status of any combination of D digital signal levels that at any time is applied on the at least one digital input signal bus.

Respective control signals of the digital circuit testing and analysis module 10 may be user controllable. The first control signal 19 of multiplexer 11 may be user controllable. The respective qualifier signals 20*a*, 20*b*, 20*c* may be user controllable. For, example, these signals may be accessible outside an ASIC circuitry via for example an input signal interface 50 as illustrated in FIG. 1.

A user interface module may be implemented on an ASIC or SOC chip separately from the digital circuit testing and analysis module 10 since multiple instances of digital circuit testing and analysis modules 10 may be implemented in a same ASIC or SOC chip. Input registers in the user interface module can hold respective values for as long as a specific test and analysis requires, or until values are changed for example by user interactions or feedback from the circuitry under test, or for example by a running test and analysis program interfaced to the user interface module. The user interface module may also comprise output registers receiving for example test and/or status signals from specific digital circuit testing and analysis modules embedded into a chip circuitry, in addition to other possible signals of interest during testing and/or analysis. Such signals can be accessible via the output interface 51 illustrated in FIG. 1, for example.

A computer running a test and analysis program may be connected to the user interface module of an ASIC or SOC chip. Several specific designs of a user interface module is found in prior art. It is in principle a set of registers holding user controllable parameters and a set of registers able to receive test results etc. from the chip under test and analysis. The program running in the computer can initialize the memory 22 with specific patterns required by a test and analysis. Prior art "read and write" electronics of the memory 22 is not illustrated in FIG. 2. Further, other external electrical contact pins (or ports) on the ASIC chip can be used to read out results of respective tests or analysis. Therefore, when monitoring the test and/or analysis status signal 23 in the example of embodiment of FIG. 3A, a test and analysis program can record the outcome of the test and analysis from respective 64k different input signal combinations from one single compact memory in one memory read out cycle.

Respective different digital input signal busses may require different tests or analysis. Therefore, a specific content of the memory 22 may be downloaded when a specific digital signal input bus 21*a*, 21*b*, 21*c* is selected. It is also possible to change the content of the memory 22 during test and analysis of a same specific digital input signal bus. This may be under control of the test and analysis program and/or via user interactions with the test and analysis program.

In FIG. 2, multiple signal delay units 12 is providing a same propagation time of all signals passing through the digital circuit testing and analysis module 10 from input to output. For example, when a qualifier signal 13*a* is compared with the output bit from the memory 22 in the AND gate 16, the respective signals must be correlated (overlapping) in time when the AND function is active (i.e. the output signal 23 is interpreted as the result or answer of the test and analysis). The output signal is denoted as a test and/or analysis status signal 23.

Figure 3:
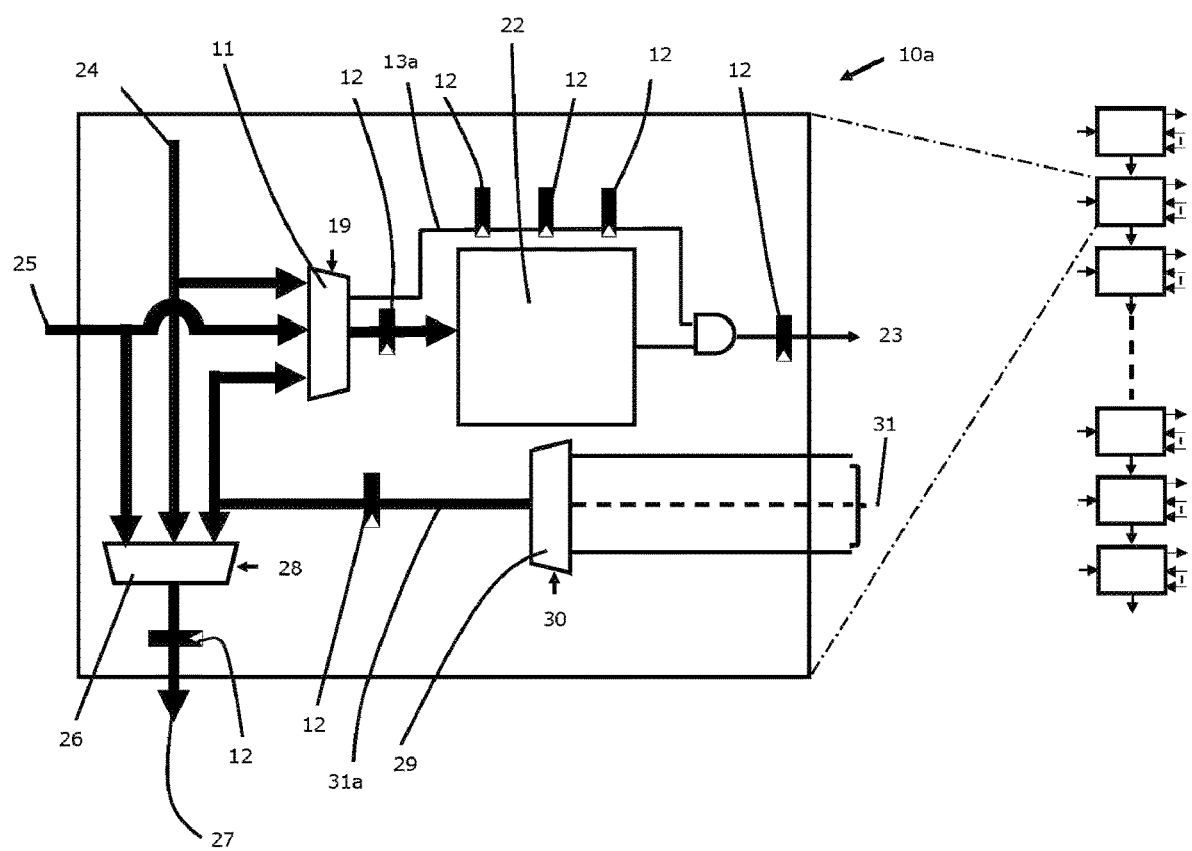
FIG. 3A illustrates further details of an example of embodiment of the present invention.
FIG. 3B illustrates further aspects of the example of embodiment of FIG. 3A.

FIG. 3A illustrates further examples of possible functional extensions to the architecture of the example of digital circuit testing and analysis module 10 illustrated in FIG. 2. The digital input signal busses of the digital circuit testing and analysis module 10*a* of FIG. 3A comprises a first digital signal input bus 24, a second digital signal input bus 25 in addition to a third digital signal input bus 31. The third digital signal input bus 31 may be connectable for example to the test and/or analysis status signal 23 from other digital circuit testing and analysis modules 10, 10*a*. For example, one of the connected test and/or analysis status signals may be from the digital circuit testing and analysis module itself. All three digital input signal busses 24, 25, 31 are connected to the multiplexer 11 controlled by the first control signal 19.

The third digital signal input bus 31 is also connected to a multiplexer 29 user controllable by a second control signal 30. The multiplexer 29 can receive status signals (for example test and/or analysis status signals) and other signals from a plurality of digital circuit testing and analysis modules in addition to itself, i.e. the test and/or analysis status signal 23 can be connected to an input of the multiplexer 29. The test and/or analysis status signals 23 from respective digital circuit testing and analysis modules 10, 10*a* is not always logic one. By identifying respective combination of the test and/or analysis status signals 23 from a group of digital circuit testing and analysis modules, it is for example possible to track how state-full data of respective digital signals changes over time, and weather these changes are correct, i.e. the changes are allowed and expected.

The multiplexer 29 can be configured for example to select different subgroups among all input signals. For example, the multiplexer 29 may be configured to receive sixteen digital signals inputs and selects groups consisting of for example four signals each, for example one of four subgroups of sixteen signals each. The output from the multiplexer 29 may be a latched output of the multiplexer 11.

The three digital input signal busses depicted in the example of embodiment in FIG. 3A is connected to a multiplexer 26 controlled by a second user controllable control signal 28 selecting one of the three busses to appear at the output of the multiplexer 26, i.e. out of the chip on the output digital signal bus 27. This possibility can be used to connect multiple digital circuit testing and analysis modules 10, 10a in different cascade connections. The output 27 of multiplexer 26 may be a latched output the same way as for the multiplexer 11 and the multiplexer 29. It is also possible that the control signal 28 can set the output in a Tri-state logic modus as known in prior art.

An example of a cascade coupling is possible for example when a digital signal input bus is limited to a width of sixteen signals and a larger number of digital signals need to be investigated. For example, a first digital circuit testing and analysis module 10a is connected to a first group of sixteen signals while a second group of sixteen signals is connected to a second digital circuit testing and analysis module 10a. The test and/or status signal 23 from the first digital circuit testing and analysis module 10a and the test and/or analysis status signal 23 from the second digital circuit testing and analysis module 10a may be read out by a test and analysis program evaluating if both, or just one, of the test and/or analysis signals 23 indicates a true or false outcome of the test and/or analysis.

Another possibility is to connect the test and/or status signal 23 from the second digital circuit testing and analysis module 10a to an input of the third digital signal input bus 31 of the first digital circuit testing and analysis module 10a. Another input of the third digital signal bus 31 of the first digital circuit testing and analysis module 10a may be connected to the test and/or analysis signal 23 from itself (i.e. the first digital circuit testing and analysis module 10a). Then the content of the memory 22 may be changed and is adapted to testing respective signal levels of the test and/or analysis status signal 23.

If the output from the multiplexer 29 is only two bits wide, in the example above, the multiplexer 11 may still be arranged to receive sixteen digital signal inputs. The two test and/analysis status signals 23 can be connected for example to the two least significant bits of the digital signal input bus 31. The internal digital signal bus 31a comprises the two least significant bits of the digital signal input bus 31 when selected while the other fourteen bits at the input of the multiplexer 11 may be grounded, for example.

In normal circumstances, the digital signal input bus 31 is for example thirty two bits wide. If thirty two instances of a digital circuit testing and analysis module 10a is implemented, a cascade coupling of the thirty two digital circuit testing and analysis modules allows the detection of any sequence of signals inside thirty two consecutive cycles.

The digital signal input bus 24 (as well as digital signal input bus 25) can be selected by the second user controllable control signal 28 as discussed above. The output digital signal bus 27 of a first digital circuit testing and analysis module 10a can then be connected to the digital signal input bus 24 (or the digital signal input bus 25) of a second digital circuit testing and analysis module 10a.

In such a configuration, the same digital signal content on the digital signal input bus is tested. However, development over time of signal levels of respective digital signals on for example the digital signal input bus 24 can be monitored by controlling respective qualifier signals in each respective digital circuit testing and analysis module 10a.

Signal development over time may be controlled by a system clock on board the ASIC or SOC. However, when testing, the test and analysis program may have access to a clock input in the user interface module 50 (refer FIG. 1) of the chip thereby bypassing (overriding) the hardwired clock on board the chip. ASIC and SOC systems may operate with time cycles comprising multiple clock phases. When there is a development of signal levels over time, changes of signal levels are often correlated with specific clock phases of respective time cycles. A test and analysis program can use the qualifier signals to establish at which corresponding clock phase a change of digital signals may happen. By initializing the memory 22 of respective digital circuit testing and analysis modules 10a with correct patterns, a plurality of digital circuit testing and analysis modules 10a can test signal level development (or state-full data) correlated with multiple consecutive clocks of the chip being tested or analyzed.

According to a further example of embodiment of the present invention, a digital testing and analysing system comprises at least one digital circuit testing and analysis module (10, 10a).

It is also within the scope of the present invention having a plurality of digital circuit testing and analysis modules (10, 10a) connected in a cascade coupling.

It is also within the scope of the present invention to correlate respective qualifier signals with physical clock phases on a chip under test. For example, respective clock phases can be read out from the chip (refer the output interface 51 in FIG. 1) under test by a test and analysis program enabling the test and analysis program to set correctly timed qualifier signals in the user interface.

FIG. 3B illustrate an example of cascade coupling a plurality of digital circuit testing and analysis modules 10a according to the present invention. The flexibility of the architecture of examples of embodiments of the digital circuit testing and analysis module 10, 10a allows a plurality of different interconnection schemes between respective digital circuit testing and analysis modules being connected in cascades.

Figure 4:
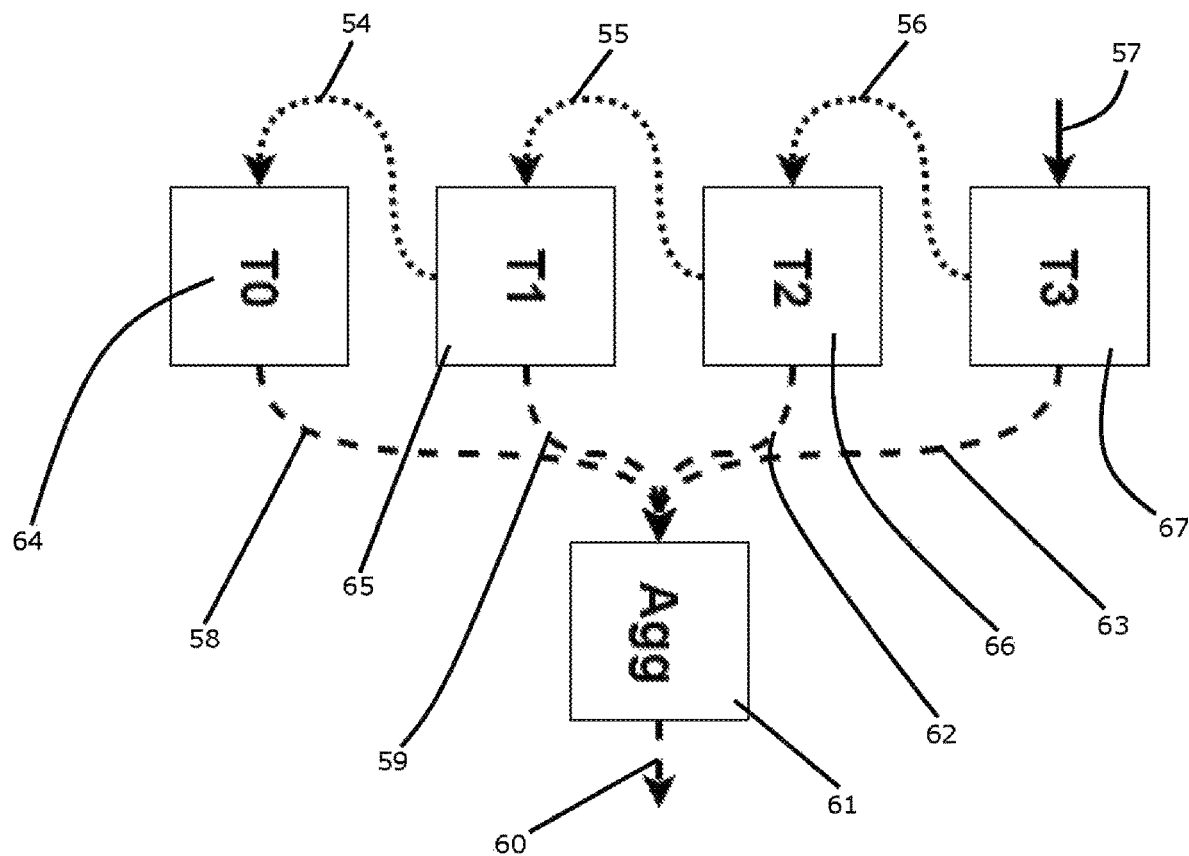
FIG. 4 illustrates an example of timing analysis setup according to the present invention.

FIG. 4 illustrate an example of cascade coupling of four instances T0 64, T1 65, T2 66, T3 67 of a test and analysis module according to the present invention.

The test situation is provided as an example. Input 57 to instance T3 is a 16 bit wide digital signal input bus (for example an ordered grouping or sequence of 16 selected internal ASIC signals).

In such tests it is not necessary that all 16 digital signal levels are at a defined level, i.e. "0" or "1". It can be a situation that just some of the digital signals are tested to have a certain signal level combination.

In the example in FIG. 4, an input signal combination of 16 signals are applied onto the input 57 of T3 67. The input signal passes through a sequence in time, in hexadecimal notation, from Fx0x, then x000A0010007, then Fx0x and then BBD3. "x" denotes "don't care" which implies that the value on this position can be any value.

When performing a test of such a sequence of signal combinations, the memory of T0 64 can be configure to detect 0Fx0x, T1 65 can be configured to detect xA17, T2 66 can be configured to detect Fx0x and T3 67 can be configured to detect BBD3. The configuration of the respective test and analysis modules implies downloading respective test patterns into the memory 22 of each respective module.

This implies that T0 should have a logic "1" on an address given by the signal levels forming the hexadecimal number Fx0x. Since there are two "don't cares" in the number, all memory locations spanning all combinations of each "x", and in combination with each other, should be initialized with logic "1", i.e. 256 memory locations.

T1 should be initialized with a logic "1" on all addresses from 0A17 to FA17.

T2 should be initialized the same way T0 is initialized.

T3 should be initialized with a logic "1" on the address BBD3, i.e. just one address.

The input 57 of T3 67 can be for example be organized as in the example illustrated in FIG. 3A. Here the input 25 is connected to a multiplexer 26 controlled by the user controllable control signal 28. In the example in FIG. 4, the input 57 is connected to a corresponding input 25 of FIG. 3A while a cascading of the input of T3 is a connection from the corresponding multiplexer output 27 to a next input 25 of a next test and analysis module. In FIG. 4 the connection 56 connects T3 to T2, the connection 55 connects T2 to T1, and the connection 54 connects T1 to T0.

The timing associated with the changing sequence of signal levels may be controlled by applying different control signals on the respective instances of the test an analysis module T0, T1, T2, and T3. For example, the qualifier signal 13a of FIG. 2. The respective qualifier signals may be accessible by a computer running a test and analysis program vie an input interface 50 illustrated in FIG. 1.

The respective test and/or analysis status signals 23 form each respective instance of the digital testing and analysis modules T0, T1, T2 and T3 is connected to an result aggregation circuitry Agg 61. Dependent on the test and analysis, the Agg circuit can for example be a 4-port AND gate, which implies that if all four inputs are logic "1" the output signal 60 is also logic "1", i.e. the test and analysis is ok.

Other test results can also be foreseen. Therefore, it is preferable to use for example the digital signal input lines 31 as discussed in connection with FIG. 3A. In this manner, a memory of an instance of the digital testing and analysis module can be initialized with different patterns enabling testing, verification and analysis of different sequences of digital signal lines of a circuit being tested and/or analyzed.

The timing sequence can be related to different timing situations. For example, the ASIC under test and analysis operates with a clock defining cycles of operations. Another possibility is that a circuitry of the ASIC is implemented as a state machine. Changes of a state machine can happen dependent on other conditions and is in its nature an asynchronous event. Another possibility is that a cycle of the ASIC comprises clock pulses (for example t0, t1, t2, t3) associated with timing events inside respective cycles. In all this examples it is possible to control the respective qualifier signals of the respective instances of the test and analysis modules according to the present invention.

With reference to FIG. 3A, it is also possible to control the test sequence discussed above by controlling for example the output form the multiplexer 22 used in the cascade coupling with the control signal 28. For example, the input lines 31 connected to the multiplexer 29 can be grounded. The output from the multiplexer 29 is connected to one of the inputs of the multiplexer 26, and when the control signal 28 by default is selecting this input, the cascaded output comprises "Zero". Then, if the address of the memory of the test and analysis module is set to a logic "0" at address "Zero" the test is not valid. If a test is performed, the control signal is configures to select one of the two other digital signal input busses 24 and 25.

It is also possible to combine the control signal 28 of a first test and analysis module in a cascade coupling with a qualifier signal 13a of a next test and analysis module in the cascade coupling receiving the output 27 form the first test and analysis module.

In this manner both simple timing criteria and complex or conditional timing criteria can be configured.

The example of timing analysis discussed above may comprise situations wherein a faulty signal level combination that is detected is not the result of a pure logical error in the design. The fault can be due to signal not foreseen digital signal delays in the design. For example, the detection between the timing events associated with T3 and T2 can be correct logically if the timing difference between T3 and T2 is long enough. For example, if the frequency of signal changes is high, cross talk may cause erroneous signal levels that is not rooted in logical (design errors). Other causes may be due to improper signal line terminations, for example.

Therefore, it is within the scope of the present invention to use incremental changes to the point in time wherein a qualifier signal should be issued. For example, a correct logical test could be performed at low clock frequency to overcome any faulty interpretation of signal levels. When such a test is successful, a clock frequency could be applied between T3 and T2 for example, and if a wrong signal level combination is detected the timing between T3 and T2 can be increased with a defined $\Delta t$ increment. If the nominal point in time is $t_i$ for the qualifier signal associated with T3, the point in time of issuing the qualifier signal for T2 is $t_i+\Delta t$. When the result of the test is identified to be correct the designer has knowledge about the physical quality of the signal lines in question and may make a necessary redesign to correct any problems. Sometimes it can also be of interest to decrease the time difference between two consecutive timing events. Therefore, for example if the nominal point in time for T3 is $t_i$, then $t_i-\Delta t$ will be the point in time for T2.

The increments or decrements can be performed iteratively until a test or analysis result is identified.

According to a method of the present invention, a timing analysis configuration may be accomplished by configuring at least a first instance of a test and analysis module in a cascading configuration with at least a second instance of the test and analysis module in the circuitry of an ASIC 40, wherein respective timing conditions are controllable by a testing and analysis program running in a connected computer system controlling respective control signals of respective instances of the testing and analysis modules by issuing respective control signals according to conditioned as well as unconditioned timing events.

The examples of test configurations above are just given as some simple basic possibilities of the digital circuit testing and analysis module 10, 10a of the present invention. The flexibility of the architecture of embodiments of the present invention does not limit the digital circuit testing and analysis module not to be configured to be part of other test configurations.

It is further within the scope of the present invention that a digital circuit testing and analysis module has at least one digital signal input bus. It is further within the scope of the present invention that a digital signal input buss comprises at least one signal. It also within the scope of the present invention that a control signal comprises at least one signal line.

According to an example of embodiment of the present invention, digital circuit testing and analysis module (10, 10*a*) may comprise:
- at least one digital signal input bus comprising D digital signals,
- a memory (22) configured to have $2^D \times$ one-bit memory locations,
- wherein the D digital signals are applied as a numerical read out address of respective one-bit memory locations of the memory (22),
- respective one-bit memory locations are pre-updated with a bit-value indicating a test and/or analysis status of the combination of any D digital signal levels that at any time is applied on the at least one digital input signal bus.

Further, the digital circuit testing and analysis module (10, 10*a*) according to the present invention, wherein the at least one digital signal input bus may be associated with a qualifier signal (20*a*, 20*b*, 20*c*, 13*a*).

Further, the digital circuit testing and analysis module (10, 10*a*) according to the present invention, wherein the at least one qualifier signal may be configured to qualify one-bit memory locations of the memory (22) addressed by the corresponding numerical value of the D digital signal levels,
- wherein an output signal from the memory (22) qualified by the at least one qualifier signal is the test and/or analysis status (23) of the D combined digital signal levels.

Further, the digital circuit testing and analysis module (10, 10*a*) according to the present invention, wherein the memory (22) is configured to be a memory of $2^E \times F$ bits memory words, wherein E<D, F>1, wherein the multiple of F×E bits equals $2^D$.

Further, the digital circuit testing and analysis module (10, 10*a*) according to the present invention, wherein the at least one digital signal input bus is divided into a first bus (13) and a second bus (17),
- wherein the first bus (13) is addressing one of the $2^E$ memory words (18) of the memory (22), while the second bus (17) selects a one-bit cell of the output word (18) of length F addressed by the first bus (13).

Further, the digital circuit testing and analysis module (10, 10*a*) according to the present invention, wherein output words (18) of the memory (22) may be connected to a multiplexer (15), wherein the second bus (17) is a control signal of the multiplexer (15) selecting the one-bit of the output word (18) associated with the numerical value of the at least on digital signal input bus.

Further, the digital circuit testing and analysis module (10, 10*a*) according to the present invention may comprise at least three digital signal input busses, a first digital signal input bus (21*a*), a second digital signal input bus (20*b*) and a third digital signal input bus (20*c*),
- wherein the three digital signal busses are connected to a multiplexer (11), wherein a first control signal (19) selects which one of the three digital input signal busses that is multiplexed to the output of the multiplexer,
- wherein the digital signal-output from the multiplexer addresses the memory (22).

Further, the digital circuit testing and analysis module according to the present invention, wherein the third digital signal input bus is connected to a multiplexer (29) controlled by a second control signal (30), wherein digital input signals connected to the input side of the multiplexer (29) are test and/or analysis status signals (23) from a plurality of other digital circuit testing and analysis modules (10, 10*a*).

Further, the digital circuit testing and analysis module (10, 10*a*) according to the present invention, wherein at least one of the connected test and/or analysis status signals (23) to the multiplexer (29) may be from the digital circuit testing and analysis module (10, 10*a*) the multiplexer (29) is located.

Further, the digital circuit testing and analysis module according to the present invention, wherein the analysis module (10, 10*a*) is embedded into an ASIC or SOC chip circuitry.

According to an example of embodiment of the present invention, a digital circuit testing and analysing system may comprise at least one instance of a digital circuit testing and analysis module (10, 10*a*) according to the present invention.

Further, the digital testing and analysis system according to the present invention, wherein a plurality of digital circuit testing and analysis modules (10, 10*a*) may be connected in a cascade coupling.

According to an example of embodiment of the present invention, a method of analysing timing events in a digital circuit utilizes at least one instance of a digital circuit testing and analysis module (10, 10*a*) according to the present invention embedded in circuitry of a chip to be tested and analysed, the method may comprise steps of:
- configuring respective test and analysis status bits of the one-bit memory of the at least one instance of the digital circuit testing and analysis module (10, 0*a*)
- configuring a qualifier signal enabling the test and/or analysis status (23) of the at least one instance of the testing and analysis module, wherein issuing of the qualifier signal is associated with a timing event in the circuitry to be tested and analysed.

Further, the method according to the present invention, wherein a plurality of digital circuit testing and analysis modules are connected in a cascade coupling, wherein a first one of the plurality of modules is configured to receive a selected group of digital signals to be tested and analysed on a digital signal input bus (24, 25),
- configuring a digital signal output bus (27) from a multiplexer (26) controllable by a control signal (28) of the first one of the plurality of testing and analysis modules to be connected to a digital input bus (24, 25) of a second one of the plurality of testing and analysis modules,
- configuring the memory of at least the first one of the plurality of digital testing and analysis modules to detect a first instance of signals levels of the selected group of signals,
- configuring the memory of at least the second one of the plurality of digital testing and analysis modules to detect a second instance of signal levels of the selected group of signals,
- aggregating the test and/or analysis status (23) from at least the first one and from at least the second one of the plurality of testing and analysis modules, wherein each respective one of the testing and analysis modules (10, 10*a*) are associated with different timing events in a test and analysis cycle of the digital circuitry under test and analysis.

Further, the method according to the present invention, wherein the aggregation of the respective test and/or analysis status signals (23) may be performed in the instance of the digital testing and analysis module (10, 10*a*) being associated with a last timing event in the test and analysis cycle.

Further, the method according to the present invention, wherein respective test and/or analysis status signals from each instance of the digital testing and analysis module in the cascade coupling is connected to a digital signal input bus of the digital testing and analysis module (10, 10*a*) being associated with the last timing event in the test and analysis cycle.

Further, the method according to the present invention, wherein respective timing events of the circuitry to be tested are conditioned timing events and/or unconditioned timing events.

Further, the method according to the present invention, wherein the point in time when the qualifier signal associated with a timing event is issued is incremented or decremented with a defined amount relative to a nominal point in time for the timing event.

The invention claimed is:

1. A digital circuit testing and analysis module configured to be embedded in a digital integrated circuit comprising:
    a memory configured to have $2^D \times$ one-bit wide memory locations; and
    at least three digital signal input busses including a first digital signal input bus, a second digital signal input bus and a third digital signal input bus;
    wherein each of the at least three digital signal input busses includes D digital signal lines, where D is an integer greater than zero;
    wherein the first digital signal input bus and the second digital signal input bus is electrically connected to a first multiplexer, wherein a first control signal selects one of the first and second digital signal input busses to be multiplexed to an output of the first multiplexer, wherein a digital signal output from the first multiplexer is a D-bit wide digital signal that addresses the memory;
    wherein the third digital signal input bus is connected to a second multiplexer controlled by a second control signal, wherein digital input signals connected to the input side of the second multiplexer are test and/or analysis status signals from a plurality of other digital circuit testing and analysis modules; and
    wherein the $2^D \times$ one-bit wide memory locations are pre-updated with one bit-value indicating a test and/or analysis status of the combination of any D digital signal levels that at any time is applied on the at least one digital input signal bus.

2. The digital circuit testing and analysis module of claim 1, wherein the at least one digital signal input bus is associated with a qualifier signal.

3. The digital circuit testing and analysis module of claim 2, wherein the at least one qualifier signal is configured to qualify one-bit wide memory locations of the memory addressed by the corresponding numerical value of the D-bit wide digital signal levels, and wherein an output signal from the memory qualified by the at least one qualifier signal is the test and/or analysis status of the D combined digital signal levels.

4. The digital circuit testing and analysis module of claim 1, wherein the memory is configured to be a memory of $2^E \times F$ bits memory words, wherein E<D, F>1, wherein the multiple of F×E bits equals 2D.

5. The digital circuit testing and analysis module of claim 4, wherein the at least one digital signal input bus is divided into a first bus and a second bus, wherein the first bus is addressing one of the $2^E$ memory words of the memory, while the second bus selects a one-bit cell of an output word of length F addressed by the first bus.

6. The digital circuit testing and analysis module of claim 5, wherein output words of the memory is connected to a multiplexer, wherein the second bus is a control signal of the multiplexer selecting the one-bit of the output word associated with the numerical value of the at least one digital signal input bus.

7. The digital circuit testing and analysis module of claim 1, wherein at least one of the connected test and/or analysis status signals to the multiplexer is from the digital circuit testing and analysis module the multiplexer is located.

8. The digital circuit testing and analysis module of claim 1, wherein the analysis module is embedded into an ASIC or SOC chip circuitry.

9. A digital circuit testing and analyzing system comprising a plurality of digital circuit testing and analysis modules configured to be embedded in a digital integrated circuit connected in a cascade coupling, each digital circuit testing and analysis module including:
    a memory configured to have $2^D \times$ one-bit wide memory locations; and
    at least three digital signal input busses including a first digital signal input bus, a second digital signal input bus and a third digital signal input bus;
    wherein each of the at least three digital signal input busses includes D digital signal lines, where D is an integer greater than zero;
    wherein the first digital signal input bus and the second digital signal input bus is electrically connected to a first multiplexer, wherein a first control signal selects one of the first and second digital signal input busses to be multiplexed to an output of the first multiplexer, wherein a digital signal output from the first multiplexer is a D-bit wide digital signal that addresses the memory;
    wherein the third digital signal input bus is connected to a second multiplexer controlled by a second control signal, wherein digital input signals connected to the input side of the second multiplexer are test and/or analysis status signals from a plurality of other digital circuit testing and analysis modules; and
    wherein the $2^D \times$ one-bit wide memory locations are pre-updated with one bit-value indicating a test and/or analysis status of the combination of any D digital signal levels that at any time is applied on the at least one digital input signal bus.

10. The method of claim 9, wherein the aggregation of the respective test and/or analysis status signals is performed in the instance of the digital testing and analysis module being associated with a last timing event in the test and analysis cycle.

11. The method of claim 10, wherein respective test and/or analysis status signals from each instance of the digital testing and analysis module in the cascade coupling is connected to a digital signal input bus of the digital testing and analysis module being associated with the last timing event in the test and analysis cycle.

12. The method according to claim 9, wherein respective timing events of the circuitry to be tested are conditioned timing events and/or unconditioned timing events.

13. The method according to claim 9, where the method further comprises the steps of:
    configuring respective test and analysis status of the read-out address associated with a digital stimuli pattern of the one-bit wide memory of the at least one digital circuit testing and analysis module; and
    configuring a qualifier signal enabling the test and/or analysis status of the at least one testing and analysis module, wherein issuing of the qualifier signal is associated with a timing event in the circuitry to be tested and analyzed.

14. The method according to claim 13, wherein the point in time when the qualifier signal associated with a timing event is issued is incremented or decremented with a defined amount relative to a nominal time in point for the timing event.

15. A method of analyzing timing events in a digital circuit, the method comprising:

providing a plurality of digital circuit testing and analysis modules are connected in a cascade coupling, wherein a first one of the plurality of modules is configured to receive a selected group of digital signals to be tested and analyzed on a digital signal input bus, the digital circuit testing and analysis module including:

at least one digital signal input bus comprising D digital signal lines, where D is an integer greater than zero and where the D digital signal lines provide a D-bit wide digital stimuli pattern;

a memory configured to have $2^D \times$one-bit wide memory locations;

wherein the D-bit wide digital signals are applied as a numerical read-out address of $2^D \times$one-bit wide memory locations of the memory; and wherein the $2^D \times$one-bit wide memory locations are pre-updated with one bit-value indicating a test and/or analysis status of the combination of any D digital signal levels that at any time is applied on the at least one digital input signal bus;

configuring a digital signal output bus from a multiplexer controllable by a control signal of the first one of the plurality of testing and analysis modules to be connected to a digital input bus of a second one of the plurality of testing and analysis modules;

configuring the memory of at least the first one of the plurality of digital testing and analysis modules to detect a first instance of signals levels of the selected group of signals;

configuring the memory of at least the second one of the plurality of digital testing and analysis modules to detect a second instance of signal levels of the selected group of signals; and aggregating the test and/or analysis status from at least the first one and from at least the second one of the plurality of testing and analysis modules, wherein each respective one of the testing and analysis modules are associated with different timing events in a test and analysis cycle of the digital circuitry under test and analysis.

* * * * *